United States Patent
Wood et al.

(10) Patent No.: US 7,960,829 B2
(45) Date of Patent: Jun. 14, 2011

(54) SUPPORT STRUCTURE FOR USE IN THINNING SEMICONDUCTOR SUBSTRATES AND FOR SUPPORTING THINNED SEMICONDUCTOR SUBSTRATES

(75) Inventors: Alan G. Wood, Boise, ID (US); Warren M. Farnworth, Nampa, ID (US); David R. Hembree, Boise, ID (US); Sidney B. Rigg, Meridian, ID (US); William M. Hiatt, Eagle, ID (US); Peter Benson, Boise, ID (US); Kyle K. Kirby, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/216,617

(22) Filed: Aug. 31, 2005

(65) Prior Publication Data
US 2006/0001139 A1 Jan. 5, 2006

Related U.S. Application Data

(62) Division of application No. 10/666,742, filed on Sep. 19, 2003, now Pat. No. 7,713,841.

(51) Int. Cl.
*H01L 23/12* (2006.01)
(52) U.S. Cl. .......... 257/732; 257/E23.083; 257/E23.188
(58) Field of Classification Search .......... 257/787–790, 257/678–679, 684, 704–705, 723, 792–793, 257/795, 778, 727, 685, 784, 686, 690, 688, 257/619, 620, 730, 732, E23.083, E23.188, 257/E23.194; 361/761–764, 783, 803, 770, 758, 742; 438/483, 460, 464
See application file for complete search history.

(56) References Cited

U.S. PATENT DOCUMENTS

| | | | |
|---|---|---|---|
| 3,976,288 A | 8/1976 | Cuomo, Jr. | |
| 4,266,334 A | 5/1981 | Edwards et al. | |
| 4,925,515 A | 5/1990 | Yoshimura et al. | |
| 5,114,880 A * | 5/1992 | Lin | 438/107 |
| 5,121,256 A | 6/1992 | Corle et al. | |
| 5,268,065 A | 12/1993 | Grupen-Shemansky | |
| 5,460,703 A | 10/1995 | Nulman et al. | |
| 5,547,906 A | 8/1996 | Badehi | |

(Continued)

FOREIGN PATENT DOCUMENTS
EP 0 023 231 B1 2/1981

OTHER PUBLICATIONS

Miller et al., "Maskless Mesoscale Materials Deposition", Deposition Technology, Sep. 2001, pp. 20-22.

(Continued)

*Primary Examiner* — Quoc D Hoang
(74) *Attorney, Agent, or Firm* — TraskBritt (57) ABSTRACT

A support structure for use with a semiconductor substrate in thinning, or backgrinding, thereof, as well as during post-thinning processing of the semiconductor substrate includes a portion that extends substantially along and around an outer periphery of the semiconductor substrate to impart the thinned semiconductor substrate with rigidity. The support structure may be configured as a ring or as a member that substantially covers an active surface of the semiconductor substrate and forms a protective structure over each semiconductor device carried by the active surface.

19 Claims, 10 Drawing Sheets

U.S. PATENT DOCUMENTS

| | | |
|---|---|---|
| 5,610,683 A | 3/1997 | Takahashi |
| 5,675,402 A | 10/1997 | Cho et al. |
| 5,703,493 A | 12/1997 | Weeks et al. |
| 5,705,016 A | 1/1998 | Senoo et al. |
| 5,723,385 A | 3/1998 | Shen et al. |
| 5,803,797 A | 9/1998 | Piper |
| 5,824,457 A | 10/1998 | Liu et al. |
| 5,827,394 A | 10/1998 | Lu |
| 5,833,869 A | 11/1998 | Haas et al. |
| 5,843,527 A | 12/1998 | Sanada |
| 5,869,354 A | 2/1999 | Leedy |
| 5,919,520 A | 7/1999 | Tateyama et al. |
| 5,953,590 A | 9/1999 | Piper et al. |
| 6,018,463 A * | 1/2000 | Winslow et al. ............... 361/803 |
| 6,033,589 A | 3/2000 | Lin |
| 6,039,830 A | 3/2000 | Park et al. |
| 6,040,248 A | 3/2000 | Chen et al. |
| 6,042,976 A | 3/2000 | Chiang et al. |
| 6,048,948 A | 4/2000 | Tochioka |
| 6,111,306 A * | 8/2000 | Kawahara et al. ............ 257/666 |
| 6,114,253 A | 9/2000 | Jang et al. |
| 6,140,151 A | 10/2000 | Akram |
| 6,143,590 A * | 11/2000 | Ohki et al. .................... 438/122 |
| 6,150,240 A | 11/2000 | Lee et al. |
| 6,198,163 B1 | 3/2001 | Crowley et al. |
| 6,245,646 B1 | 6/2001 | Roberts |
| 6,251,488 B1 | 6/2001 | Miller et al. |
| 6,259,962 B1 | 7/2001 | Gothait |
| 6,268,584 B1 | 7/2001 | Keicher et al. |
| 6,284,044 B1 | 9/2001 | Sakamoto et al. |
| 6,303,469 B1 | 10/2001 | Larson et al. |
| 6,322,598 B1 | 11/2001 | Meuris et al. |
| 6,323,295 B1 | 11/2001 | Muhlebach et al. |
| 6,326,698 B1 | 12/2001 | Akram |
| 6,338,982 B1 | 1/2002 | Beroz et al. |
| 6,339,255 B1 * | 1/2002 | Shin .............................. 257/686 |
| 6,344,402 B1 | 2/2002 | Sekiya |
| 6,391,251 B1 | 5/2002 | Keicher et al. |
| 6,399,464 B1 | 6/2002 | Muntifering et al. |
| 6,413,150 B1 | 7/2002 | Blair |
| 6,432,752 B1 | 8/2002 | Farnworth |
| 6,461,881 B1 | 10/2002 | Farnworth et al. |
| 6,462,273 B1 * | 10/2002 | Corisis et al. ................. 174/521 |
| 6,462,401 B2 | 10/2002 | Fujii |
| 6,465,329 B1 | 10/2002 | Glenn |
| 6,468,832 B1 * | 10/2002 | Mostafazadeh .............. 438/112 |
| 6,471,806 B1 | 10/2002 | McKenna et al. |
| 6,472,294 B2 | 10/2002 | Meuris et al. |
| 6,486,939 B2 | 11/2002 | Lin |
| 6,489,042 B2 | 12/2002 | Imken et al. |
| 6,498,074 B2 | 12/2002 | Siniaguine et al. |
| 6,506,688 B2 | 1/2003 | Wu |
| 6,524,881 B1 | 2/2003 | Tandy et al. |
| 6,537,482 B1 | 3/2003 | Farnworth |
| 6,551,906 B2 | 4/2003 | Oka |
| 6,562,661 B2 | 5/2003 | Grigg |
| 6,582,983 B1 | 6/2003 | Runyon et al. |
| 6,589,818 B2 * | 7/2003 | Usami et al. .................. 438/118 |
| 6,593,171 B2 | 7/2003 | Farnworth |
| 6,617,671 B1 * | 9/2003 | Akram .......................... 257/668 |
| 6,621,161 B2 * | 9/2003 | Miyawaki ..................... 257/723 |
| 6,627,997 B1 | 9/2003 | Eguchi et al. |
| 6,680,241 B2 | 1/2004 | Okamoto et al. |
| 6,683,378 B2 | 1/2004 | Wing et al. |
| 6,686,225 B2 | 2/2004 | Wachtler |
| 6,734,032 B2 | 5/2004 | Tandy et al. |
| 6,736,896 B2 | 5/2004 | Lin |
| 6,740,962 B1 | 5/2004 | Grigg |
| 6,746,899 B2 | 6/2004 | Grigg |
| 6,749,688 B2 | 6/2004 | Tateyama et al. |
| 6,908,784 B1 | 6/2005 | Farnworth |
| 6,940,181 B2 | 9/2005 | Derderian et al. |
| 6,949,158 B2 * | 9/2005 | Ball et al. ...................... 156/154 |
| 6,974,721 B2 | 12/2005 | Koizumi et al. |
| 7,118,938 B2 | 10/2006 | Koh |
| 7,140,951 B2 | 11/2006 | Kurosawa |
| 7,244,665 B2 | 7/2007 | Benson |
| 2001/0001740 A1 * | 5/2001 | Miyawaki ..................... 438/700 |
| 2001/0055834 A1 | 12/2001 | Lin |
| 2002/0091173 A1 | 7/2002 | Hashimoto et al. |
| 2002/0102819 A1 * | 8/2002 | Tamura et al. ................ 438/483 |
| 2002/0171177 A1 | 11/2002 | Kritchman et al. |
| 2003/0003688 A1 | 1/2003 | Tandy et al. |
| 2003/0059708 A1 | 3/2003 | Yamamura et al. |
| 2003/0077399 A1 | 4/2003 | Ptoyrailo et al. |
| 2003/0151167 A1 | 8/2003 | Kritchman et al. |
| 2004/0229002 A1 | 11/2004 | Davis et al. |
| 2005/0064679 A1 | 3/2005 | Farnworth et al. |
| 2005/0064681 A1 | 3/2005 | Wood et al. |
| 2005/0064683 A1 | 3/2005 | Farnworth et al. |
| 2006/0109630 A1 * | 5/2006 | Colgan et al. ................. 361/718 |

OTHER PUBLICATIONS

Miller, "New Laser-Directed Deposition Technology", Microelectronic Fabrication, Aug. 2001, p. 16.

Webpage, Objet Prototyping the Future, "Objet FullCure700 Series", (2003) 2 pages.

Webpage, Objet Prototyping the Future, "How it Works", (2003) 2 pages.

* cited by examiner

SUPPORT STRUCTURE FOR USE IN THINNING SEMICONDUCTOR SUBSTRATES AND FOR SUPPORTING THINNED SEMICONDUCTOR SUBSTRATES

CROSS-REFERENCE TO RELATED APPLICATION

This application is a divisional of application Ser. No. 10/666,742, filed Sep. 19, 2003, now U.S. Pat. No. 7,713,841, issued May 11, 2010.

This application is also related to U.S. patent application Ser. No. 10/666,930 filed Sep. 19, 2003, abandoned, and U.S. patent application Ser. No. 10/928,381 filed Aug. 27, 2004, abandoned.

BACKGROUND OF THE INVENTION

1. Field of the Invention

The present invention relates to structures for supporting semiconductor substrates during and following thinning thereof. More specifically, the present invention relates to support structures that are configured to entirely cover at least the outer peripheral portions of the active surfaces of semiconductor substrates to impart the semiconductor substrates with some rigidity following thinning thereof.

2. Background of Related Art

Since its inception, the trend in electronics has been to develop devices of ever-decreasing dimensions and ever-increasing capabilities. In order to drive these trends, semiconductor device manufacturers continually develop new technologies to put more processing power, more memory, and more ancillary functionality into the same or smaller amounts of space.

One of the approaches that has been taken for reducing the size of semiconductor device packages or for facilitating the incorporation of more semiconductor dice into packages of a standard size has been to reduce sizes of the various package features, including the wire bond heights, the thicknesses of adhesive layers, the thickness of packaging material that covers the package components, and the thicknesses of the semiconductor dice themselves.

The thicknesses of semiconductor dice may be reduced prior to singulation thereof from a semiconductor substrate, typically in the form of a silicon wafer, by reducing the thickness of the entire semiconductor substrate. This is typically done by so-called "backgrinding" processes, which include mechanical or chemical removal of material from the back side of the semiconductor substrate and, thus, from the devices, or dice, that have been fabricated on the opposite, active surface thereof.

State-of-the-art backgrinding processes are useful for reducing the thicknesses of 200 mm diameter silicon wafers, which are typically about 728 µm thick, and 300 mm diameter wafers, which are typically about 800 µm thick, to as thin as about 50 µm. When the thickness of a semiconductor substrate is reduced, however, the semiconductor substrate becomes less robust. For example, when the thickness of a 200 mm diameter silicon wafer is reduced to about 230 µm or less, it becomes pliable and is prone to sagging when positioned on an edge or when an edge thereof is handled. As a consequence of the reduced robustness of thinned semiconductor substrates, the semiconductor devices that have been fabricated thereon are more likely to be damaged when thinned semiconductor substrates are handled or packaged.

Moreover, when semiconductor substrates are thinned, they are typically secured, in active surface-down orientation, to a carrier, such as a vacuum chuck. While the semiconductor substrate may be adequately secured to the carrier, the active surface of the semiconductor substrate may not be completely sealed from chemical backgrinding/polishing agents or particles of removed material. Thus, material may be removed from the active surface of the semiconductor substrate or the active surface may become undesirably contaminated.

Accordingly, there are needs for structures and methods for supporting semiconductor substrates and for sealing the active surfaces thereof during and following thinning thereof.

SUMMARY OF THE INVENTION

The present invention includes a support structure, or carrier, for semiconductor substrates. The support structure is configured to be disposed upon an active surface of a semiconductor substrate and to structurally support and impart rigidity to at least an outer peripheral portion of the semiconductor substrate.

In one embodiment, the support structure comprises a ring that covers only the outer peripheral portion of the active surface of the semiconductor substrate. An outer peripheral edge of the ring extends substantially to or beyond an outer peripheral edge of the semiconductor substrate. An inner peripheral edge of the ring laterally surrounds an interior portion of the active surface of the semiconductor substrate, on which semiconductor devices have been fabricated. Thus, the semiconductor devices are laterally within the inner peripheral edge of the ring.

Another embodiment of the support structure includes an outer peripheral section that covers the outer peripheral portion of the active surface of the semiconductor substrate, as well as an interior section, which comprises a plurality of protective structures for each of the semiconductor devices that have been fabricated on the active surface of the semiconductor substrate. The outer peripheral and interior sections of the support structure may be integral with one another. The thicknesses of these sections may be substantially the same as or different from one another.

In another aspect, the present invention includes semiconductor substrates with support structures that incorporate teachings of the present invention on at least portions of active surfaces thereof.

The present invention, in another aspect thereof, also includes methods for forming support structures on and securing support structures to the active surfaces of semiconductor substrates. In one embodiment of such a method, a support structure may be formed on an active surface of a semiconductor substrate by selectively consolidating regions of a layer of an unconsolidated material that has been applied to or otherwise formed over the active surface. In another embodiment, a support structure of the present invention may be molded onto an active surface of a semiconductor substrate. In yet another embodiment, a preformed film may be applied and laminated to an active surface of a semiconductor substrate, and then so-called "subtractive" processes may be used to form a support structure therefrom.

Additionally, the present invention includes methods for thinning and processing semiconductor substrates while support structures that incorporate teachings of the present invention are secured to active surfaces thereof. The present invention also includes methods for removing support structures of the present invention from semiconductor substrates.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which depict exemplary features of various aspects of the present invention.

DETAILED DESCRIPTION OF THE INVENTION

Figure 1:
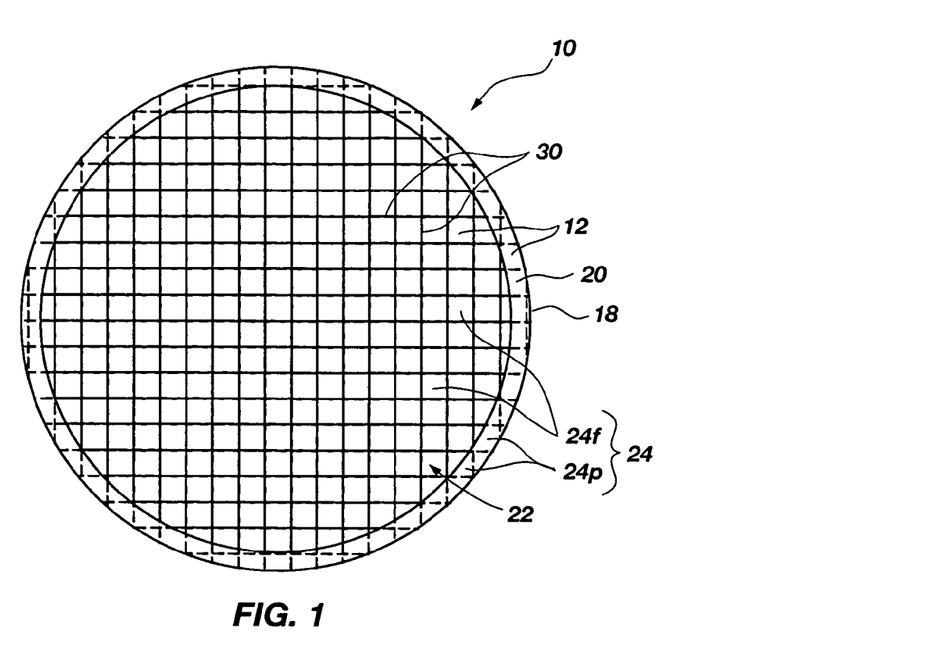
FIG. 1 is a top view of an exemplary semiconductor substrate, depicted as a wafer, which is shown as including a plurality of semiconductor devices on an active surface thereof.

An example of a semiconductor substrate 10 is shown in FIG. 1. As illustrated, semiconductor substrate 10 may comprise a wafer of a semiconductor material, such as silicon, gallium arsenide, or indium phosphide.

Semiconductor substrate 10 includes two opposite major surfaces, one of which is commonly referred to in the art as an "active surface" 12 and the other of which is typically referred to in the art as a "back side" 16 (see FIGS. 3, 4A, 4B, 6, 8, and 9). Both active surface 12 and back side 16 are bounded by an outer peripheral edge 18 of semiconductor substrate 10. When semiconductor substrate 10 comprises a full wafer, as in the depicted example, outer peripheral edge 18 forms the circumference of the wafer.

An edge bead removal area 20 may be located on active surface 12, adjacent to outer peripheral edge 18. Edge bead removal area 20 is a relatively narrow feature (e.g., three millimeters across) which may extend around the entire outer periphery of semiconductor substrate 10. Notably, processing of semiconductor substrates 10 that lack edge bead removal areas 20 is also within the scope of the present invention, although not specifically depicted in the drawings.

Within the interior of edge bead removal area 20 or, if a semiconductor substrate 10 lacks an edge bead removal area 20, of outer peripheral edge 18, at an interior section 22 of active surface 12, semiconductor substrate 10 may include a plurality of semiconductor devices 24. Adjacent semiconductor devices 24 are separated from one another by streets 30, which extend across interior section 22 of active surface 12, such as in the illustrated grid-like configuration. At least some of the semiconductor devices 24 that are located adjacent to outer peripheral edge 18 of semiconductor substrate 10 comprise only blanks 24p, while semiconductor devices 24f are located somewhat internally from outer peripheral edge 18.

Alternatively, although not shown in the drawings, semiconductor substrate 10 may lack semiconductor devices 24 on interior section 22 of active surface 12 thereof. This is because it may be desirable to thin a semiconductor substrate 10 prior to fabricating structures, such as semiconductor devices, thereon or therefrom. For example, the loss of semiconductor devices and the expenses incurred in fabricating the same may be avoided if a thinned semiconductor substrate 10" (FIG. 14B) without any semiconductor devices thereon breaks or is otherwise damaged during the thinning process. Alternatively, one entity may thin semiconductor substrates 10, then provide the thinned semiconductor substrates 10" to one or more other entities for further processing (e.g., device fabrication).

In the illustrated examples, each semiconductor device 24 includes one or more bond pads 27 (FIGS. 8 and 9), which facilitate electrical communication with integrated circuitry of that semiconductor device 24.

Turning now to FIGS. 2 through 4B, an example of a support structure according to the present invention, in this case a support ring 40, 40', 40a', 40b', 40c' (shown in FIGS. 3, 4A, 4B, 4C, and 4D, respectively) is depicted. As shown, support ring 40, 40', 40a', 40b', 40c' is positioned on active surface 12 of semiconductor substrate 10, over edge bead removal area 20 thereof. Support ring 40, 40', 40a', 40b', 40c' extends completely around an outer periphery 13 of active surface 12.

An outer peripheral edge 42, 42' of support ring 40, 40', 40a', 40b', 40c' is in substantial alignment with (FIG. 3) or is located outside (FIGS. 4A and 4B) of outer peripheral edge 18. An interior edge 44 of support ring 40, 40', 40a', 40b', 40c' defines surfaces of an aperture 45 through support ring 40, 40', 40a', 40b', 40c'. Interior section 22 of active surface 12 and, thus, all of the semiconductor devices 24f thereon are completely surrounded by interior edge 44 of support ring 40, 40', 40a', 40b', 40c' and exposed through aperture 45 thereof.

Support ring 40, 40', 40a', 40b', 40c' is formed from a material that is compatible with the material or materials of semiconductor substrate 10. The material of support ring 40, 40', 40a', 40b', 40c' will, along with the thickness of support ring 40, 40', 40a', 40b', 40c', impart a thinned semiconductor substrate 10" (FIG. 14B) with the desired amount of rigidity. For example, it may be desirable to impart a thinned semiconductor substrate 10" with approximately the same amount of rigidity as that of the semiconductor substrate 10 prior to thinning thereof. As another example, it may be desirable to impart a thinned semiconductor substrate 10" with sufficient rigidity to prevent bending, sagging, or other nonplanarity thereof during processing or transportation thereof following the thinning process.

In addition, the material from which support ring 40, 40', 40a', 40b', 40c' is formed may be substantially impervious to chemicals (e.g., wet and dry etchants) that may be used in backgrinding processes, as well as compatible with conditions of any post-thinning processes.

The material from which support ring 40, 40', 40a', 40b', 40c' is formed may also facilitate or enhance sealing of support ring 40, 40', 40a', 40b', 40c' to a support structure, such as a vacuum chuck, as semiconductor substrate 10 is being thinned or otherwise processed.

It is also desirable to form support ring 40, 40', 40a', 40b', 40c' from a material that has a coefficient of thermal expansion (CTE) that is as close as possible to that of the material or materials from which semiconductor substrate 10 is formed (e.g., silicon has a CTE of about $2.9 \times 10^{-6}/°C$.), thereby preventing warpage of semiconductor substrate 10 and delamination of support ring 40, 40', 40a', 40b', 40c' therefrom during processing of semiconductor substrate 10 (e.g., thinning or any processing that occurs thereafter).

Exemplary materials that may be used to form support ring 40, 40', 40a', 40b', 40c' include consolidatable materials that are useful in layered manufacturing processes (e.g., photoimageable polymers that are useful in stereolithography processes), photoresists, thermoset polymers (e.g., moldable silicones), and the like. While many of these materials may be less rigid than desired or have CTEs that differ significantly from the material or materials of semiconductor substrate 10, fillers may be added thereto to impart the materials and, thus, support ring 40, 40', 40a', 40b', 40c' with the desired properties. Examples of fillers that may be used with any of the foregoing materials include, but are not limited to, silica (i.e., glass, silicon) particles, alumina (i.e., ceramic) particles, nitride (e.g., silicon nitride, boron nitride) particles, and polymeric particles or fibers (e.g., poly(p-phenyleneterephtalamide) fibers, which are marketed under the tradename KEVLAR® by E.I. du Pont de Nemours & Company of Wilmington, Del.). Photoimageable polymers that are useful in stereolithography processes may have CTEs of about $55 \times 10^{-6}/°C$. When a silica filler material is included therein, with the mixture including about 50%, by weight, photoimageable polymer and about 50%, by weight, silica particles, the CTE of the mixture is lowered significantly, to about $32 \times 10^{-6}/°C$. Fillers may also increase or enhance the fracture toughness (e.g., KEVLAR®), strength, rigidity, thermal properties (e.g., boron nitride), or structural integrity of the material (e.g., photoimageable polymer, photoresist, thermoset polymer, etc.) within which they are mixed.

Along with the materials from which support ring 40, 40', 40a', 40b', 40c' is formed, the dimensions or configuration thereof may provide the desired properties. For example, as illustrated in FIGS. 3 through 4D, a support ring 40, 40', 40a', 40b', 40c' according to the present invention may have a width W that is at least as great as the width of edge bead removal area 20 (i.e., typically about 3 mm or more).

Figure 3:
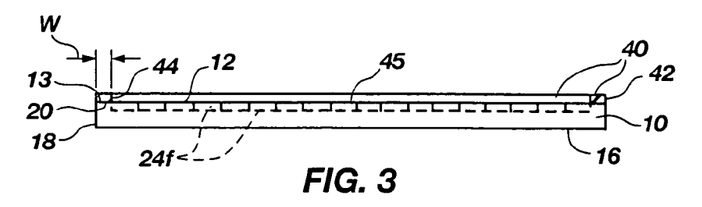
FIG. 3 is a cross-section taken along line 3-3 of FIG. 2, depicting a first example of the manner in which the outer periphery of the support structure may be associated with an outer peripheral edge of the semiconductor substrate.
Figure 4A:
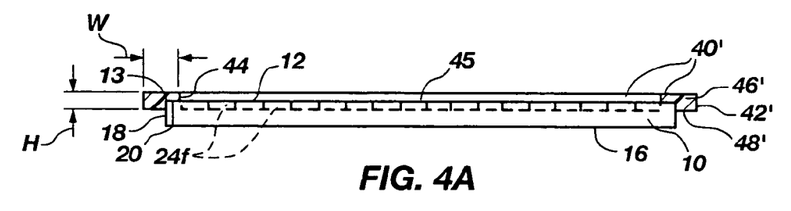
FIGS. 4A through 4D are cross-sections that are also taken along line 3-3 of FIG. 2, illustrating second and third examples of the manner in which the outer periphery of the support structure may be associated with an outer peripheral edge of the semiconductor substrate.
Figure 4B:
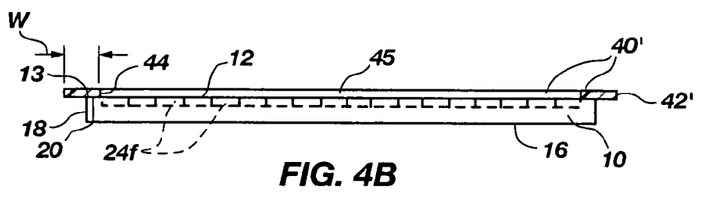
Figure 4C:
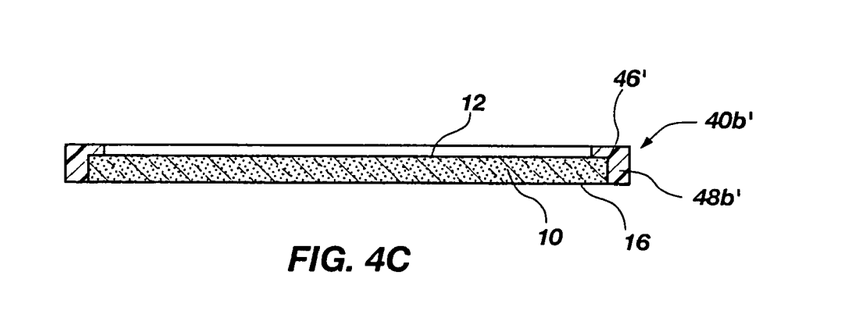
Figure 4D:
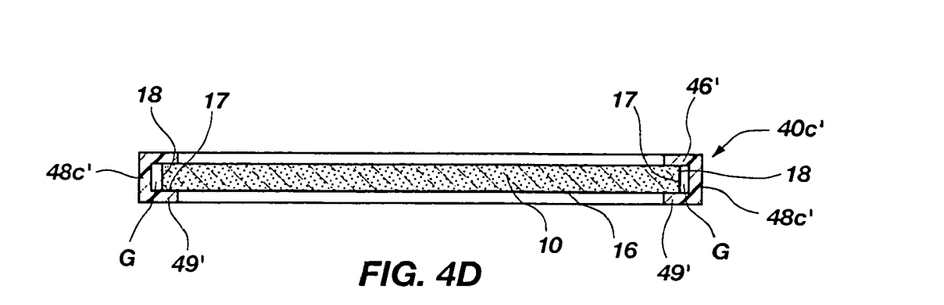

In another example, with continued reference to FIGS. 3 through 4D, the height H of support ring 40, 40', 40a', 40b', 40c' may impart support ring 40, 40', 40a', 40b', 40c' and, thus, a thinned semiconductor substrate 10" (FIG. 14B) with which support ring 40, 40', 40a', 40b', 40c' is to be used with a desired amount of rigidity. For example, depending, of course, upon the rigidity and CTE of the material from which support ring 40, 40', 40a', 40b', 40c' is formed, support ring 40, 40', 40a', 40b', and 40c' may have a height of as small as about 25 μm (one mil) to about 200 μm (eight mils) or greater.

When a thinned semiconductor substrate 10" and a support ring 40, 40', 40a', 40b', 40c' thereon will be handled or processed with equipment that is configured to handle and process semiconductor substrates of standard diameters and thicknesses, the combined height H of support ring 40, 40', 40a', 40b', 40c' and thickness of a thinned semiconductor substrate 10" (FIG. 14B) should not exceed the maximum substrate thickness (e.g., about 800 μm) that such equipment is configured to accommodate. Likewise, the outer diameter (OD) of support ring 40, 40', 40a', 40b', 40c' should not exceed the maximum substrate diameter (e.g., 200 mm, 300 mm, etc.) that equipment for handling or processing a thinned semiconductor substrate 10" may be configured to accommodate.

As shown in FIG. 3, an edge 42 of support ring 40 may be substantially coextensive and, thus, in substantial alignment with an outer peripheral edge 18 of semiconductor substrate 10.

Alternatively, as depicted in FIG. 4A, a support ring 40' may extend beyond outer peripheral edge 18 of semiconductor substrate 10, with an outer peripheral edge 42' of support ring 40' being positioned outside of outer peripheral edge 18 of semiconductor substrate 10. Accordingly, support ring 40' includes an overhang region 46', which is located beyond outer peripheral edge 18 of semiconductor substrate 10.

In addition, support ring 40' may include a circumferential support element 48' beneath overhang region 46', substantially coplanar with semiconductor substrate 10, and in substantial contact with outer peripheral edge 18. Circumferential support element 48' may have a height that is about the same as or less than the desired thickness of semiconductor substrate 10 following thinning thereof (i.e., the thickness of thinned semiconductor substrate 10" (FIG. 14B)).

Figure 2:
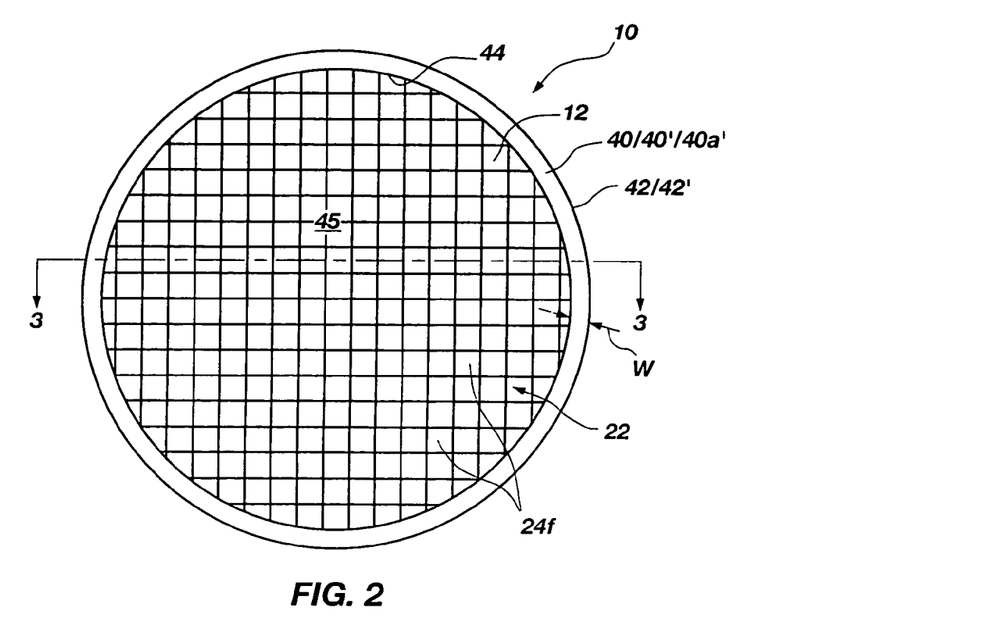
FIGS. 2 and 2A are top views of the semiconductor substrate shown in FIG. 1, with exemplary embodiments of support structures according to the present invention on the active surfaces thereof.
Figure 2A:
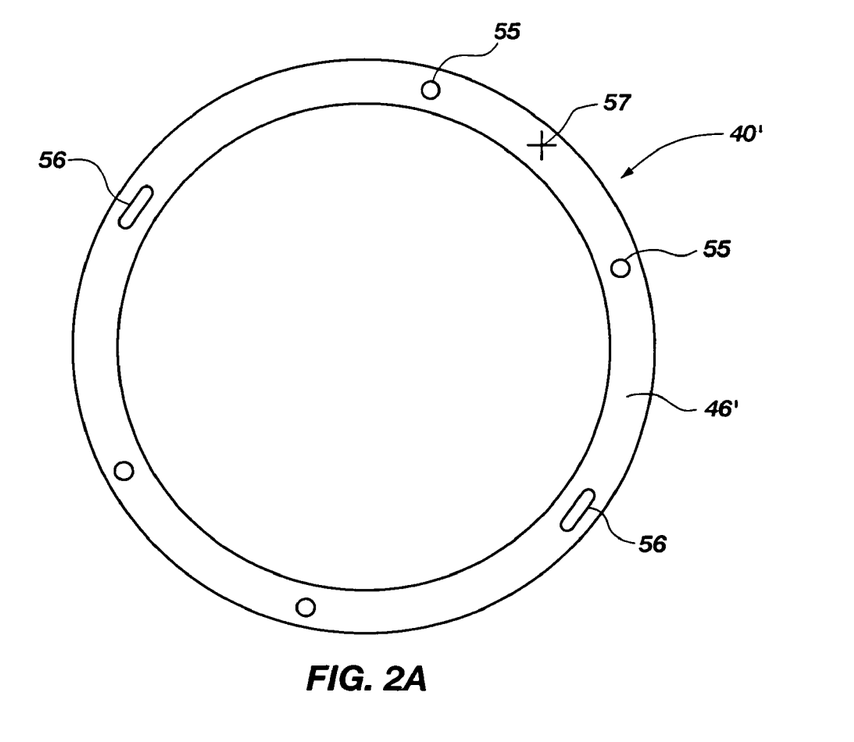

Overhang region 46' of support ring 40' or a variation thereof may include one or more ancillary features, such as one or more markings, locating features, or fixturing features. By way of example only, one or more dowel holes 55, slots 56, or fiducial marks 57 may be formed on, in, or through overhang region 46', as shown in FIG. 2A.

The support ring 40a' shown in FIG. 4B includes all of the features of support ring 40', except for circumferential support element 48' (FIG. 4A).

Shown in FIG. 4C is another variation of support ring 40b', which includes all of the features of support ring 40' (FIG. 4A). Support ring 40b' differs from support ring 40' in that circumferential support element 48b' of support ring 40b' extends from overhang region 46' substantially to, as shown, or beyond a plane in which back side 16 of semiconductor substrate 10 is located.

Once a semiconductor substrate 10 with a support ring 40b' thereon has been thinned (e.g., by chemical thinning or polishing processes), circumferential support element 48b' will protrude beyond back side 16, forming a lip (not shown) that extends completely around outer peripheral edge 18 at back side 16. Such a lip may be useful for enhancing the rigidity of the thinned semiconductor substrate 10" (see FIG. 14B), as well as for sealing back side 16 against a carrier while processing is being effected over active surface 12 of thinned semiconductor substrate 10".

FIG. 4D illustrates still another variation of support ring 40c', which includes an overhang region 46' and a circumferential support element 48c'. Circumferential support element 48c' differs from circumferential support element 48' (FIG. 4A) in that circumferential support element 48c' extends from overhang region 46' to a location beyond a plane in which back side 16 of semiconductor substrate 10 is located. In addition, circumferential support element 48c' is spaced apart from outer peripheral edge 18 of semiconductor substrate 10, providing a gap G that accommodates expansion or contraction of support ring 40c' or semiconductor substrate 10 due to CTE mismatch therebetween. Due to the presence of gap G, support ring 40c' also includes a retention ledge 49' that extends inwardly from a lower edge of circumferential support element 48c', along a plane that is parallel to a plane in which back side 16 of semiconductor substrate 10 is located, and over at least a peripheral portion 17 of back side 16, thereby trapping outer peripheral edge 18.

Figure 5:
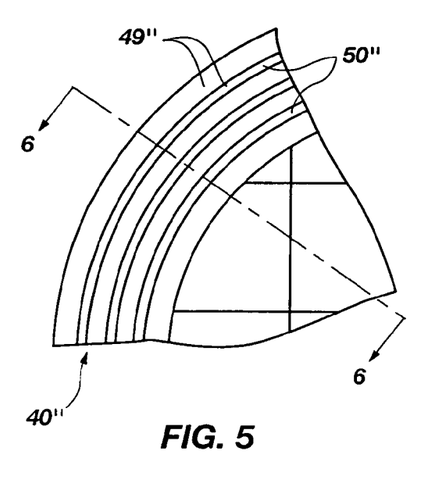
FIG. 5 is a partial top view of the semiconductor substrate shown in FIG. 1, depicting a variation of the support structure, which includes a series of concentrically positioned upwardly protruding members, each of which extends along the full extent (e.g., length, circumference, etc.) of the support structure.
Figure 6:
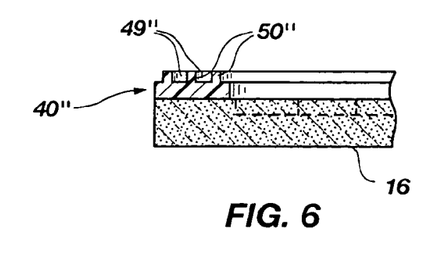
FIG. 6 is a cross-section taken along line 6-6 of FIG. 5.

As shown in FIGS. 5 and 6, another variation of support ring 40" may comprise one or more sealing elements 50", which protrude from an upper surface 49" of support ring 40". FIGS. 5 and 6 depict support ring 40" as including three concentrically arranged sealing elements 50", although support rings 40" with other numbers (i.e., as few as one or more than three) of sealing elements 50" are also within the scope of the present invention. Sealing elements 50" are somewhat compliant features that are configured to facilitate the creation of a seal between upper surface 49" of support ring 40" and a surface or feature (not shown) against which support ring 40" is to be positioned, such as a surface of a sealing ring of a vacuum chuck.

Figure 7:
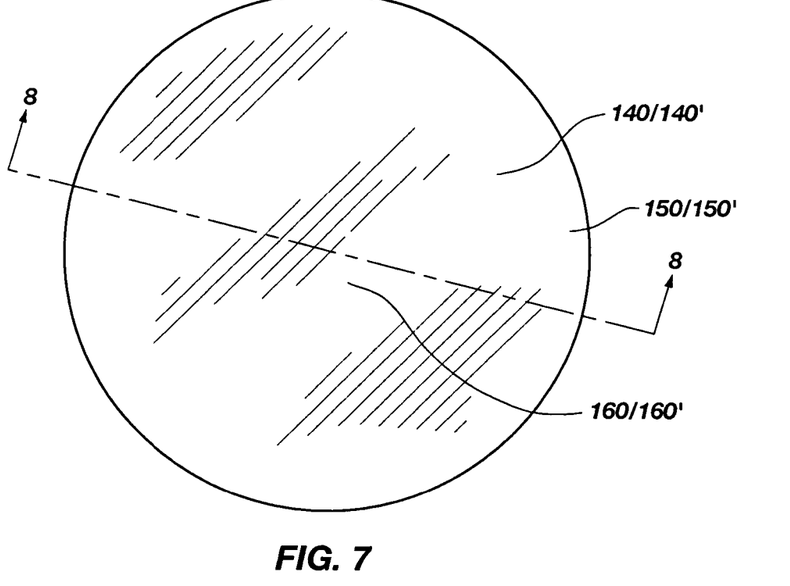
FIG. 7 is a top view of the substrate shown in FIG. 1, illustrating another exemplary embodiment of support structure that incorporates teachings of the present invention.
Figure 8:
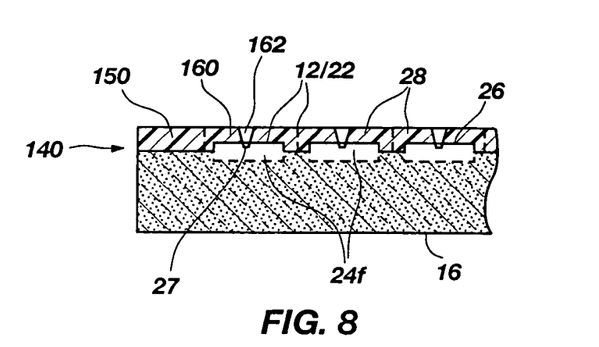
FIG. 8 is an enlarged, partial cross-section taken along line 8-8 of FIG. 7, showing a first example of the manner in which the outer periphery of the support structure may be associated with an outer peripheral edge of the semiconductor substrate.
Figure 9:
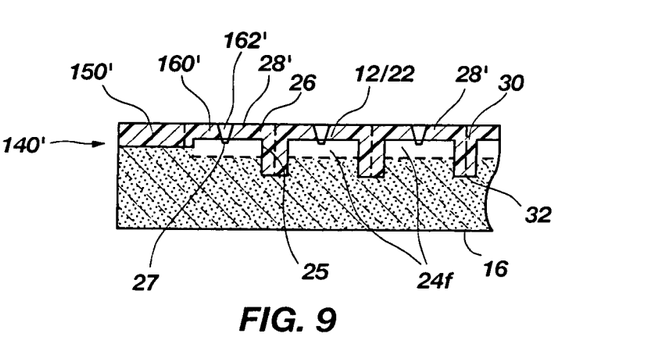
FIG. 9 is also an enlarged, partial cross-section taken along line 8-8 of FIG. 7, showing a second example of the manner in which the outer periphery of the support structure may be associated with an outer peripheral edge of the semiconductor substrate.

Features of other embodiments of support structures according to the present invention, which are referred to herein as "support members" 140, 140', are pictured in FIGS. 7 through 9. In addition to including an outer peripheral portion 150, 150' that covers an edge bead removal area 20 of active surface 12 of semiconductor substrate 10, support member 140, 140' also includes an interior portion 160, 160' that forms protective structures 28, 28' over semiconductor devices 24f that are carried by interior section 22 of active surface 12.

As FIGS. 8 and 9 illustrate, outer peripheral portion 150, 150' of support member 140, 140' may be configured substantially the same as support rings 40, 40' depicted in FIGS. 3 and 4A, respectively. In addition, although not illustrated, outer peripheral portion 150, 150' of support member 140, 140' may include one or more sealing elements, such as the sealing elements 50" that are shown in FIGS. 5 and 6.

With continued reference to FIGS. 8 and 9, each protective structure 28, 28' of interior portion 160, 160' of support member 140, 140' includes at least one aperture 162, 162' through which a corresponding bond pad 27 of the corresponding, underlying semiconductor device 24f is exposed.

FIG. 9 shows a semiconductor substrate 10', which includes trenches 32 at the locations of streets 30, material of streets 30 having been removed by known processes, such as partial cutting with a wafer saw, photolithography (e.g., mask) and etch processes, or the like, to form trenches 32. Thus, protective structure 28' covers an active surface 26 of each corresponding semiconductor device 24f, as well as at least a portion of peripheral edges 25 thereof.

No material has been removed from streets 30 of the semiconductor substrate 10 shown in FIG. 8. Accordingly, an alternative configuration of the protective structure 28' that is shown in FIG. 8 covers only the active surface 26 of a semiconductor device 24f, not any portions of the peripheral edges 25 thereof.

Like support rings 40, 40', 40a', 40b', 40c', 40", support members 140, 140' may be formed from a material that provides the desired degrees of rigidity and sealability. The thickness and other dimensions of support members 140, 140' may also factor into the rigidities thereof.

In addition, since support members 140, 140' include protective structures 28, 28', the material from which support members 140, 140' also provides other desirable properties, such as a particular level of electrical insulation, an ability to withstand subsequent processing conditions (e.g., dicing, further packaging, etc.), an ability to withstand operating conditions (e.g., temperature) to which each semiconductor device 24f is subjected when in use, a particular degree of impermeability to moisture, or the like.

Turning now to FIGS. 10 through 13B, various exemplary methods for forming support structures, including support rings 40, 40', 40" and support members 140, 140', are depicted. Although the description of these processes herein is limited to forming of a support ring 40' (FIGS. 11A through 12C) or a support ring 40 (FIGS. 13A and 13B), they are also useful for forming other embodiments of support structures that incorporate teachings of the present invention.

FIGS. 10 and 11A through 11E show a layered manufacturing process that may be used to form a support ring 40'.

Figure 10:
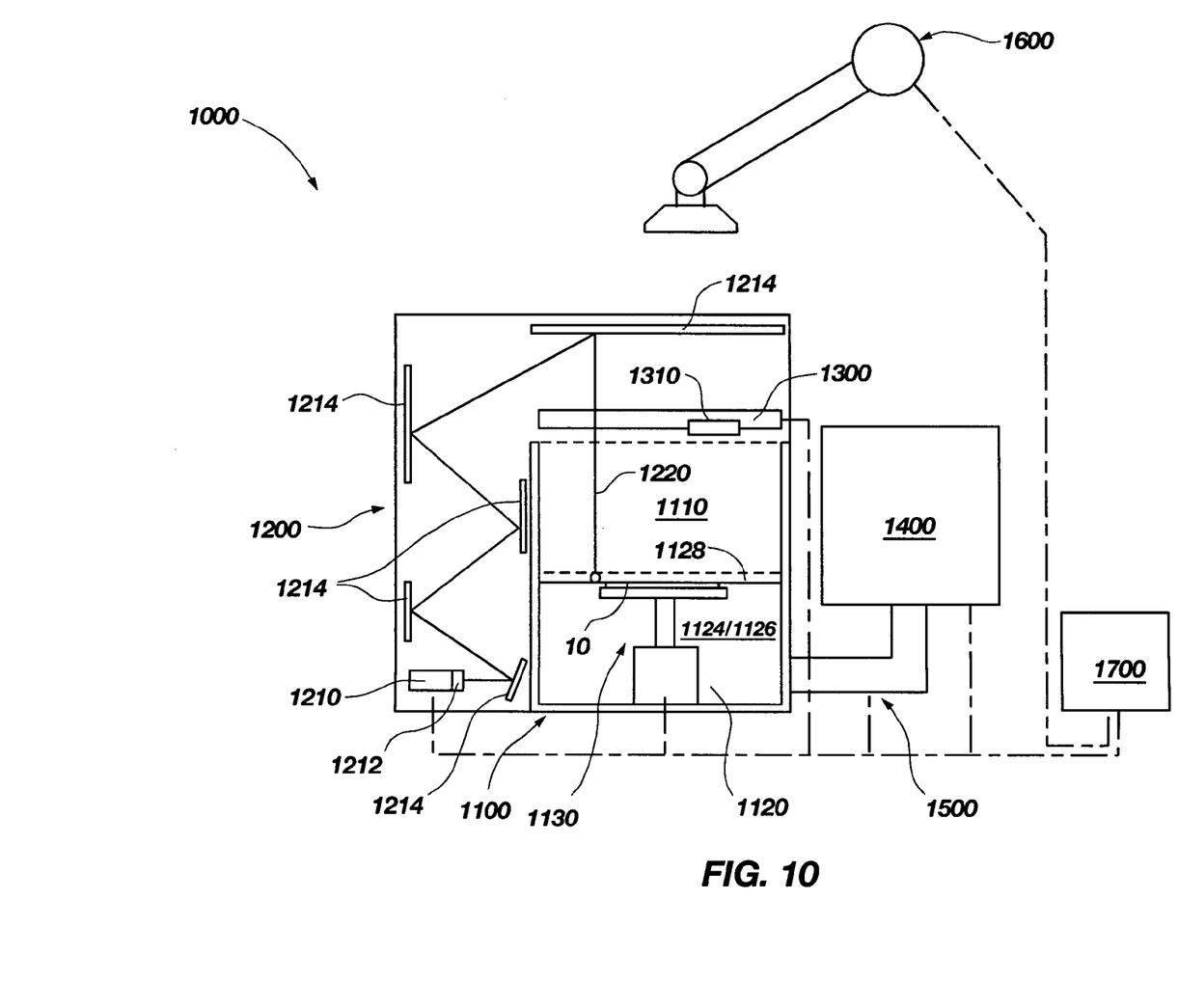
FIG. 10 is a schematic representation of an example of a layered manufacturing (e.g., stereolithography) apparatus that may be used to fabricate a support structure of the present invention upon an active surface of a semiconductor substrate.

In FIG. 10, an example of a stereolithography system 1000, which effects a type of layered manufacturing process that employs selective irradiation of radiation-curable (e.g., by ultraviolet light, etc.) curable resin, is schematically represented.

Stereolithography system 1000 includes a fabrication tank 1100 and a material consolidation system 1200, a machine vision system 1300, a cleaning component 1400, and a material reclamation system 1500 that are associated with fabrication tank 1100. The depicted stereolithography system 1000 also includes a substrate handling system 1600, such as a rotary feed system or linear feed system available from Genmark Automation Inc. of Sunnyvale, Calif., for moving fabrication substrates (e.g., semiconductor substrates 10) from one system of stereolithography system 1000 to another. Features of one or more of the foregoing systems may be associated with one or more controllers 1700, such as computer processors or smaller groups of logic circuits, in such a way as to effect their operation in a desired manner.

Controller 1700 may comprise a computer or a computer processor, such as a so-called "microprocessor," which may be programmed to effect a number of different functions. Alternatively, controller 1700 may be programmed to effect a specific set of related functions or even a single function. Each controller 1700 of stereolithography system 1000 may be associated with a single system thereof or a plurality of systems so as to orchestrate the operation of such systems relative to one another.

Fabrication tank 1100 includes a chamber 1110, which is configured to contain a support system 1130. In turn, support system 1130 is configured to carry one or more semiconductor substrates 10.

Fabrication tank 1100 may also have a reservoir 1120 associated therewith. Reservoir 1120 may be continuous with chamber 1110. Alternatively, reservoir 1120 may be separate from but communicate with chamber 1110 in such a way as to provide unconsolidated material 1126 thereto. Reservoir 1120 is configured to at least partially contain a volume 1124 of unconsolidated material 1126, such as a photoimageable polymer, or "photopolymer," particles of thermoplastic polymer, resin-coated particles, or the like.

Photopolymers believed to be suitable for use with a stereolithography system 1000 and for fabricating support structures, such as support rings 40', in accordance with teachings of the present invention, include, without limitation, Cibatool SL 5170, SL 5210, SL 5530, and SL 7510 resins. All of these photopolymers are available from Ciba Specialty Chemicals Inc. of Basel, Switzerland.

Reservoir 1120 or another component associated with one or both of fabrication tank 1100 and reservoir 1120 thereof may be configured to maintain a surface 1128 of a portion of volume 1124 located within chamber 1110 at a substantially constant elevation relative to chamber 1110.

A material consolidation system 1200 is associated with fabrication tank 1100 in such a way as to direct consolidating energy 1220 into chamber 1110 thereof, toward at least areas of surface 1128 of volume 1124 of unconsolidated material 1126 within reservoir 1120 that are located over semiconductor substrate 10. Consolidating energy 1220 may comprise, for example, electromagnetic radiation of a selected wavelength or a range of wavelengths, an electron beam, or other suitable energy for consolidating unconsolidated material 1126. Material consolidation system 1200 includes a source 1210 of consolidating energy 1220. If consolidating energy 1220 is focused, source 1210 or a location control element 1212 associated therewith (e.g., a set of galvanometers or mirrors, including one for x-axis movement and another for y-axis movement) may be configured to direct, or position, consolidating energy 1220 toward a plurality of desired areas of surface 1128. Alternatively, if consolidating energy 1220 remains relatively unfocused, it may be directed generally toward surface 1128 from a single, fixed location or from a plurality of different locations. In any event, operation of source 1210, as well as movement thereof, if any, may be effected under the direction of controller 1700.

When material consolidation system 1200 directs focused consolidating energy 1220 toward surface 1128 of volume 1124 of unconsolidated material 1126, stereolithography system 1000 may also include a machine vision system 1300. Machine vision system 1300 facilitates the direction of focused consolidating energy 1220 toward desired locations of features on semiconductor substrate 10. As with material consolidation system 1200, operation of machine vision system 1300 may be proscribed by controller 1700. If any portion of machine vision system 1300, such as a camera 1310 thereof, moves relative to chamber 1110 of fabrication tank 1100, that portion of machine vision system 1300 may be positioned so as provide a clear path to all of the locations of surface 1128 that are located over each semiconductor substrate 10 within chamber 1110.

Optionally, one or both of material consolidation system 1200 (which may include a plurality of mirrors 1214) and machine vision system 1300 may be oriented and configured to operate in association with a plurality of fabrication tanks 1100. Of course, one or more controllers 1700 would be useful for orchestrating the operation of material consolidation system 1200, machine vision system 1300, and substrate handling system 1600 relative to a plurality of fabrication tanks 1100.

Cleaning component 1400 of stereolithography system 1000 may also operate under the direction of controller 1700. Cleaning component 1400 of stereolithography system 1000 may be continuous with chamber 1110 of fabrication tank 1100 or positioned adjacent to fabrication tank 1100. If cleaning component 1400 is continuous with chamber 1110, any unconsolidated material 1126 that remains on a semiconductor substrate 10 may be removed therefrom prior to introduction of another semiconductor substrate 10 into chamber 1110.

If cleaning component 1400 is positioned adjacent to fabrication tank 1100, residual unconsolidated material 1126 may be removed from a semiconductor substrate 10 as semiconductor substrate 10 is removed from chamber 1110. Alternatively, any unconsolidated material 1126 remaining on semiconductor substrate 10 may be removed therefrom after semiconductor substrate 10 has been removed from chamber 1110, in which case the cleaning process may occur as another semiconductor substrate 10 is positioned within chamber 1110.

Material reclamation system 1500 collects excess unconsolidated material 1126 that has been removed from a semiconductor substrate 10 by cleaning component 1400, then returns the excess unconsolidated material 1126 to reservoir 1120 associated with fabrication tank 1100.

In use, controller 1700, under control of computer-aided drafting (CAD) or stereolithography (.stl) programming, may orchestrate operation of various components of stereolithography system 1000 to fabricate support structures, such as support rings 40', as well as other features.

FIGS. 11A through 11E depict an example of the manner in which a support structure, such as support ring 40', may be fabricated.

Figure 11A:
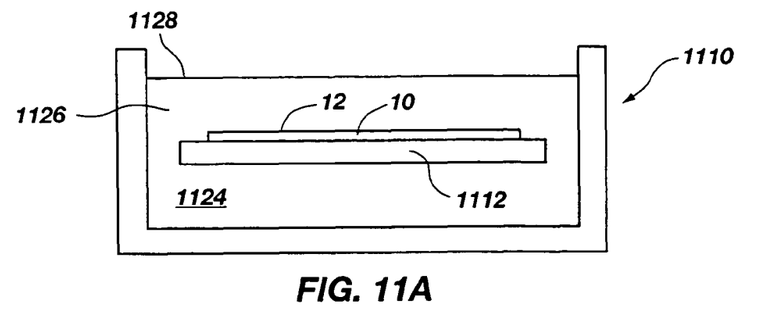
FIGS. 11A through 11E schematically depict use of the apparatus of FIG. 10 to fabricate the support structure shown in FIG. 4 upon the active surface of a semiconductor substrate.

With reference to FIG. 11A, semiconductor substrate 10 is positioned on a support platen 1112 within chamber 1110 of fabrication tank 1100 (FIG. 10). As depicted, semiconductor substrate 10 is submerged within volume 1124 of unconsolidated material 1126 so that unconsolidated material 1126 covers and fills all of the features that are located at active surface 12 of semiconductor substrate 10.

Figure 11B:
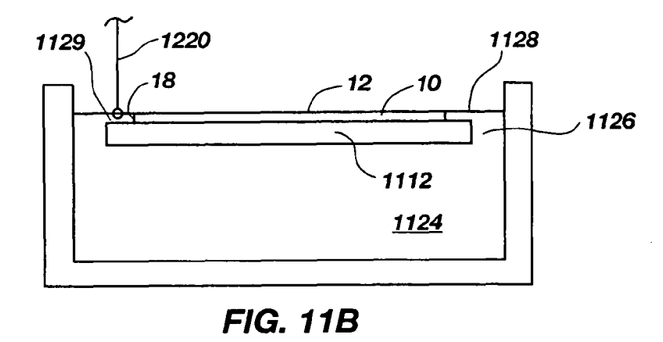

Next, as shown in FIG. 11B, support platen 1112 is raised such that the upper surface of semiconductor substrate 10 is brought to about the same level as (i.e., coplanar with) surface 1128, as shown, or above surface 1128 of volume 1124. Areas 1129 of unconsolidated material 1126 that are located adjacent to outer peripheral edge 18 of semiconductor substrate 10 are then at least partially selectively consolidated (e.g., with a laser or other focused consolidating energy 1220) to initiate the formation of circumferential support element 48' (FIGS. 4A and 11C) of support ring 40' (FIG. 4A). This process may be effected once if circumferential support element 48' comprises a single material layer, or repeated multiple times, lowering semiconductor substrate 10 in multiple increments until active surface 12 thereof is substantially planar with surface 1128 of volume 1124, if circumferential support element 48' includes a plurality of superimposed, contiguous, mutually adhered layers of material.

Figure 11C:
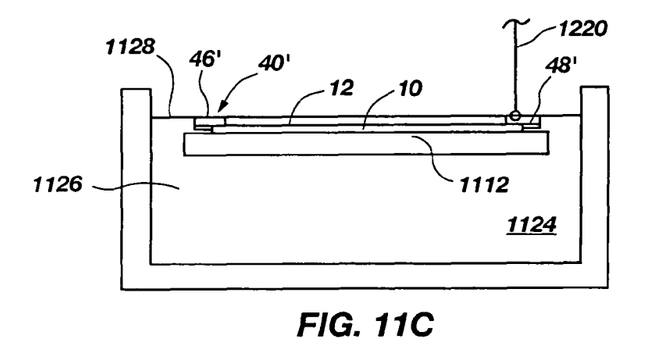

Once circumferential support element 48' has been formed, portions of support ring 40', which are located above the plane in which active surface 12 of semiconductor substrate 10 is located, including overhang region 46' thereof, may be fabricated, as shown in FIG. 11C. Support platen 1112 is lowered such that active surface 12 is submerged beneath surface 1128 of volume 1124 a distance that, considering any change in the density of unconsolidated material 1126 upon consolidation thereof, will result in a layer or sublayer of consolidated material that protrudes above active surface 12 a desired height (e.g., about one mil, about four mils, about eight mils, etc.). Unconsolidated material 1126 at locations where the fabrication of a support structure, such as support ring 40', is desired may then be selectively consolidated with focused consolidating energy 1220 (e.g., a laser beam) to form at least another layer of support ring 40'.

Figure 11D:
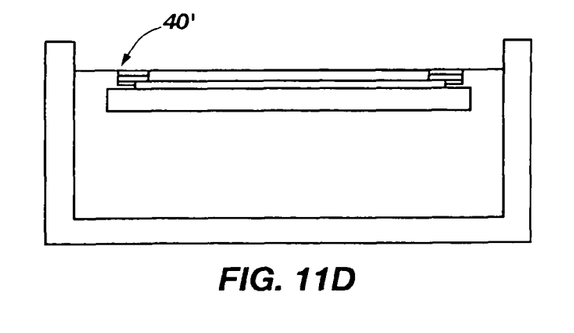

As illustrated in FIG. 11D, these processes may be repeated a number of times until a support structure, such as support ring 40', and features thereof (e.g., the sealing elements 50" shown in FIGS. 5 and 6, which may be formed as one or more separate layers from the remainder of support ring 40') have been completely formed.

Figure 11E:
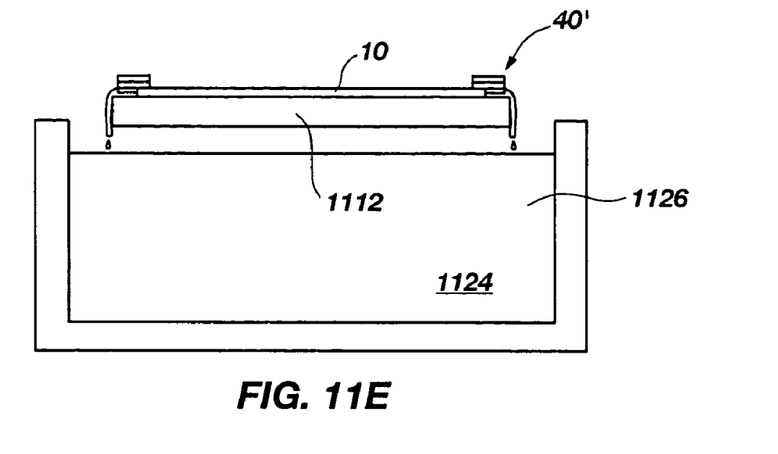

Following the fabrication of a support structure, such as support ring 40', on semiconductor substrate 10, support platen 1112 may be raised such that at least semiconductor substrate 10 and the support structure (e.g., support ring 40') carried thereby are removed from volume 1124 of unconsolidated material 1126, as shown in FIG. 11E. Thereafter, semiconductor substrate 10 and the support structure thereon may be cleaned, as known in the art.

Alternatively, a support structure according to the present invention may be formed by applying a photoresist (e.g., by spin-on processes or otherwise, as known in the art) onto active surface 12 of semiconductor substrate 10 (FIG. 1), then exposing desired regions of the photoresist to one or more suitable wavelengths of radiation (e.g., through a reticle), as in known photolithography processes, and developing the exposed regions with a chemical or chemicals that are suitable for consolidating the photoresist that has been exposed.

Figure 12A:
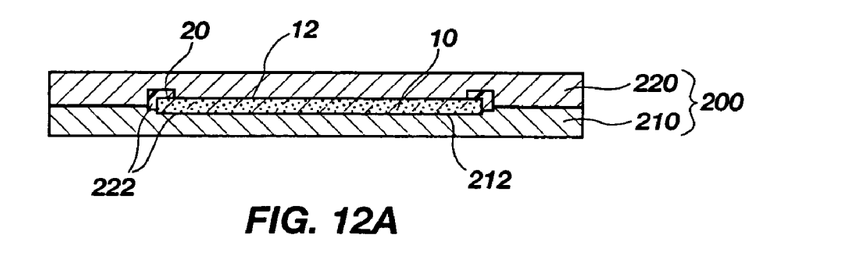
FIGS. 12A and 12B schematically depict use of molding processes to form a support structure (e.g., that shown in FIG. 3) on the active surface of a semiconductor substrate.
Figure 12B:
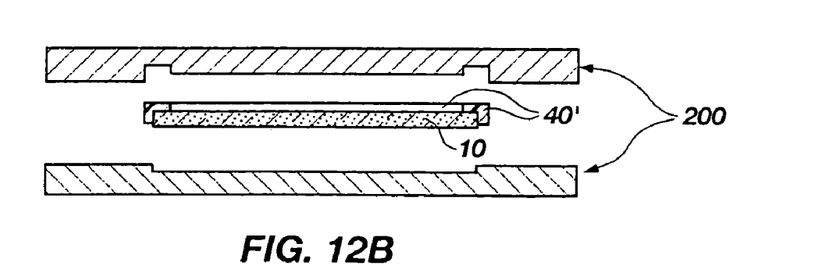

Referring now to FIGS. 12A and 12B, an exemplary process for molding a support structure, such as a support ring 40' (FIGS. 4A and 12B) in place upon a semiconductor substrate 10 is depicted.

As shown in FIG. 12A, semiconductor substrate 10 is positioned within a support cavity 212 of or otherwise supported by a first half 210 of a mold 200, with active surface 12 of semiconductor substrate 10 remaining exposed. Thereafter, a second half 220 of mold 200 is then positioned over active surface 12. Regions of active, surface 12, including edge bead removal area 20 thereof, upon which the support structure (e.g., support ring 40') is to be positioned, communicate with one or more cavities 222 of second half 220. Of course, first and second halves 210, 220 of mold 200 may include other features (e.g., runners, vents, etc.) that are positioned appropriately for the type of molding process in which mold 200 is to be used.

Once semiconductor substrate 10 has been properly positioned within mold 200, known mold processes (e.g., transfer molding, pot molding, injection molding, etc.) may be used to introduce liquid mold material from which the support structure (e.g., support ring 40') is to be formed into each cavity 222 and onto regions of active surface 12 that communicate with each cavity 222.

As shown in FIG. 12B, once the mold material has sufficiently hardened (e.g., cured, cooled, etc.), semiconductor substrate 10 and the support structure (e.g., support ring 40') that has been molded in place thereon may be removed from mold 200, as known in the art.

Figure 13A:
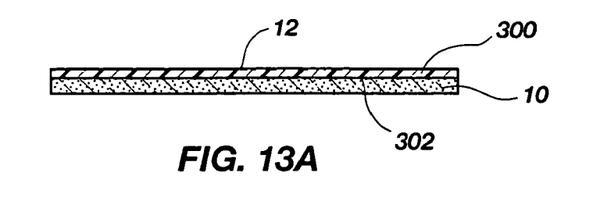
FIGS. 13A and 13B schematically depict lamination of a preformed material film to the active surface of a semiconductor substrate and use of subtractive processes to remove material of the preformed film and to thereby form a support structure therefrom.
Figure 13B:
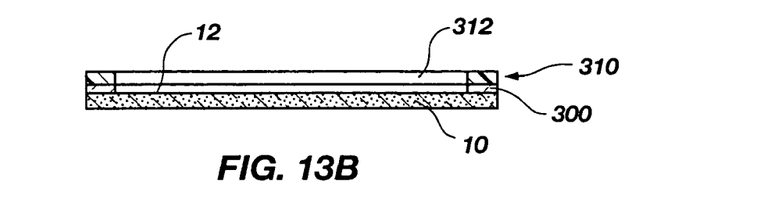

Another exemplary process for forming a support structure, such as support ring 40' on at least an active surface 12 of a semiconductor substrate 10 is pictured in FIGS. 13A and 13B.

In FIG. 13A, a preformed sheet 300 of a material from which a support structure, such as support ring 40 (FIG. 2), is to be formed is positioned over and secured to active surface 12 of semiconductor substrate 10. Preformed sheet 300 may be secured to active surface 12 by any technique that is compatible with the material of preformed sheet 300 and with semiconductor substrate 10 and semiconductor devices 24 (FIGS. 1 and 2) that have been fabricated on active surface 12 thereof. By way of nonlimiting example, preformed sheet 300 may be secured to active surface 12 with a pressure-sensitive or curable adhesive, by heating preformed sheet 300 or active surface 12, by applying solvent to at least a lower surface 302 of preformed sheet 300 or to active surface 12, or by any other suitable process known in the art.

Once preformed sheet 300 has been laminated to active surface 12, subtractive processes may be used to form a support structure according to the present invention therefrom, as shown in FIG. 13B. For example, and not to limit the scope of the present invention, a support structure (e.g., support ring 40) may be formed by the use of photolithography processes to form a mask 310 and removal of material through apertures 312 in mask 310 (e.g., with an etchant or solvent that is suitable for use in removing the material of preformed sheet 300), photoablation (e.g., which is useful with polymer films), or otherwise, as known in the art and suitable for use with the material of preformed sheet 300 and with semiconductor substrate 10 and semiconductor devices 24 (FIGS. 1 and 2) that have been fabricated on active surface 12 thereof. Mask 310 may then be removed by way of known resist strip processes.

Of course, combinations of processes for forming support structures that incorporate teachings of the present invention are also within the scope of the present invention. For example, a support ring 40, 40', 40a', 40b', 40c', 40" may be formed separately from a semiconductor substrate 10 (FIG. 1), in one or more pieces (e.g., support ring 40c' may be formed in two or more pieces), then assembled with semiconductor substrate 10 (and, in the case of support ring 40c', pieces are assembled with one another) and secured (i.e., adhered) thereto (and, in the case of support ring 40c', secured to one another), such as by stereolithography processes or with an uncured polymer (e.g., thermoset polymer or photopolymer) which is subsequently cured by exposure to radiation or heat.

Figure 14A:
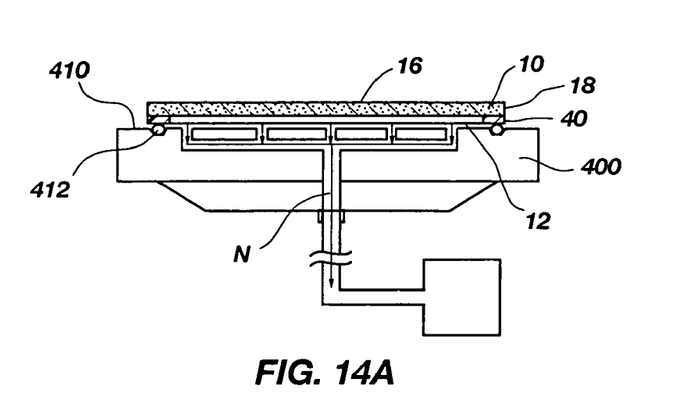
FIGS. 14A and 14B are schematic representations depicting thinning of a semiconductor substrate that has a support structure of the present invention secured to an active surface thereof.
Figure 14B:
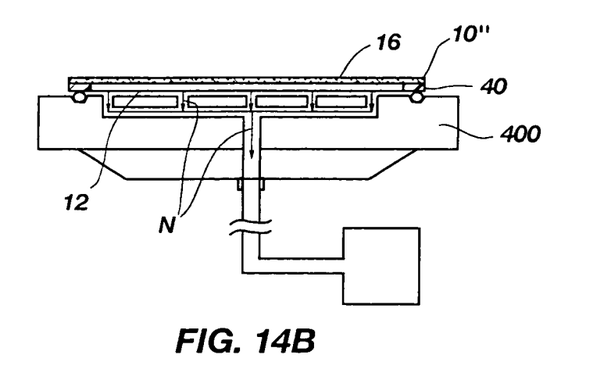

Turning now to FIGS. 14A and 14B, thinning of back side 16 of semiconductor substrate 10 is schematically depicted. Although FIGS. 14A and 14B illustrate backgrinding of a semiconductor substrate 10 that includes a support ring 40 on at least active surface 12 thereof, backgrinding may also be effected with another embodiment of support structure of the present invention on at least active surface 12, as well as with another embodiment of semiconductor substrate (e.g., semiconductor substrate 10', shown in FIG. 9).

As shown in FIG. 14A, semiconductor substrate 10 is positioned active surface 12-down over a carrier 400, for example, a vacuum chuck available from Semitool, Inc. of Kalispell, Mont. The support structure (e.g., support ring 40) on active surface 12 of semiconductor substrate 10 contacts a surface 410 of carrier 400 or a corresponding feature (e.g., an O-ring 412) thereon, and may form a seal thereagainst. Known processes (e.g., application of a negative pressure N to active surface 12 of semiconductor substrate 10) may be used to secure semiconductor substrate 10 against surface 410 or a feature (e.g., O-ring 412) thereon and, optionally, to seal active surface 12 from exposure to conditions that are present at the exterior (e.g., back side 16 and outer peripheral edge 18) of semiconductor substrate 10.

Once semiconductor substrate 10 has been secured to carrier 400, known techniques may be used to remove material from back side 16 of semiconductor substrate 10 and, thus, to thin semiconductor substrate 10 to a desired thickness, as depicted in FIG. 14B. By way of example only, known mechanical backgrinding or polishing processes (e.g., mechanical lapping techniques), chemical backgrinding or polishing processes (e.g., wet etch processes, dry etch processes, such as that described in U.S. Pat. No. 6,498,074 to Siniaguine et al., the disclosure of which is hereby incorporated herein in its entirety by this reference, etc.), or a combination of mechanical and chemical backgrinding or polishing processes may be employed to thin semiconductor substrate 10. Such thinning processes may be effected until the resulting thinned semiconductor substrate 10" has a desired thickness (e.g., a thickness of about 230 µm or less, a thickness of about 50 µm or less, etc.).

A thinned semiconductor substrate 10", which includes a support structure, such as support ring 40, on at least active surface 12 thereof, is shown in FIG. 14B.

Figure 15:
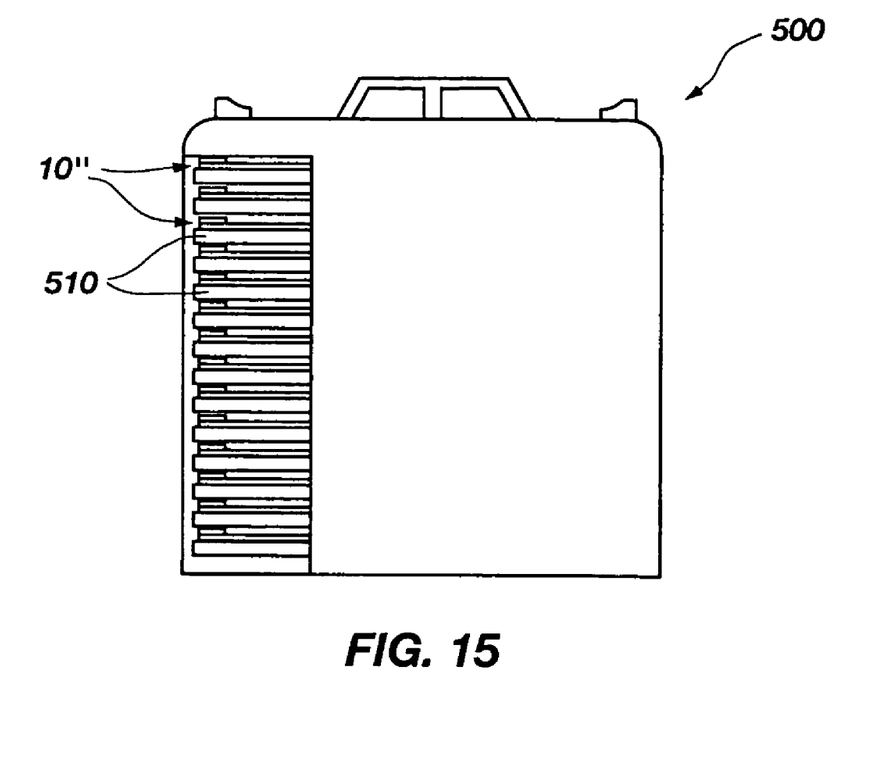
FIG. 15 is a schematic representation of a method for transporting a thinned semiconductor substrate in accordance with teachings of the present invention.

FIG. 15 schematically depicts thinned semiconductor substrates 10" of the present invention in substrate cartridges 510 of a multi-substrate cassette 500. As shown, cassette 500 includes a plurality of substrate cartridges 510, each of which is somewhat horizontally oriented and configured to receive a semiconductor substrate of standard dimensions (e.g., a 200 mm or 300 mm silicon wafer that has not been thinned). Substrates, including thinned semiconductor substrates 10" that incorporate teachings of the present invention, may be introduced into and removed from substrate cartridges 510, as known in the art (e.g., with robotic handling equipment).

Once one or more thinned semiconductor substrates 10" have been positioned within substrate cartridges 510 of cassette 500, they may be transported from process equipment in which backgrinding or thinning is effected to equipment by which thinned semiconductor substrates 10" will be further processed.

For example, thinned semiconductor substrates 10", such as those formed in accordance with teachings of the present invention, may be secured (e.g., with adhesive materials) to other substrates, such as insulators like ceramic, glass, or sapphire, to form silicon-on-insulator (SOI) type substrates, such as a silicon-on-ceramic (SOC), silicon-on-glass (SOG), silicon-on-sapphire (SOS), or similar substrates.

Figure 16:
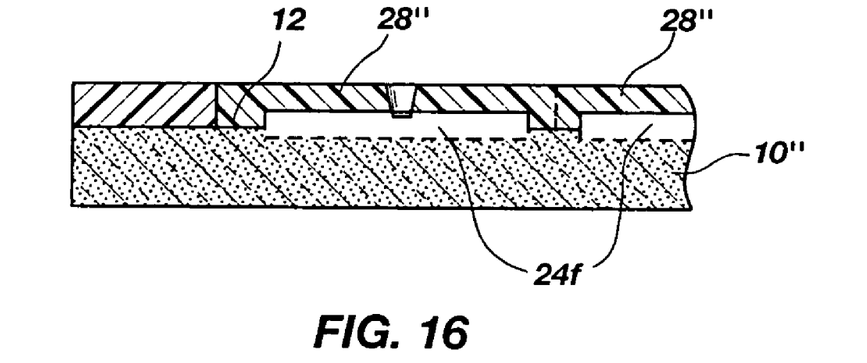
FIG. 16 schematically depicts processing of a semiconductor substrate following thinning thereof.

As another example, as shown in FIG. 16, semiconductor devices 24f that are carried by active surface 12 of a thinned semiconductor substrate 10" may be packaged by known wafer level packaging (WLP) processes (e.g., by stereolithography, by use of known layer formation and patterning processes, etc.), which typically include the formation of protective structures 28" over each semiconductor device 24f.

Figure 17A:
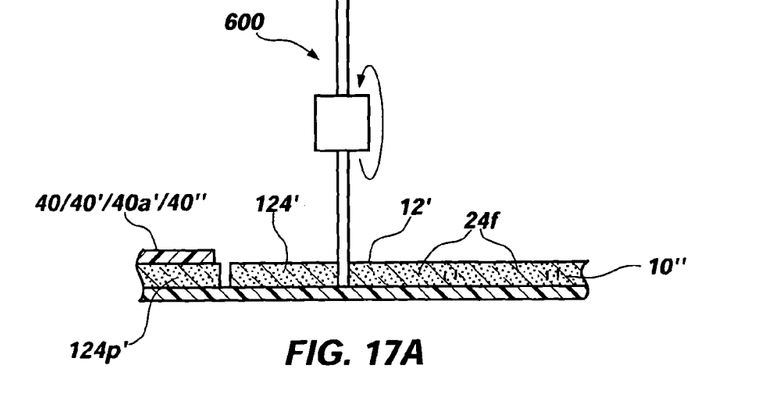
FIGS. 17A through 17C are schematic representations of a method for removing a support structure of the present invention from a thinned semiconductor substrate.
Figure 17B:
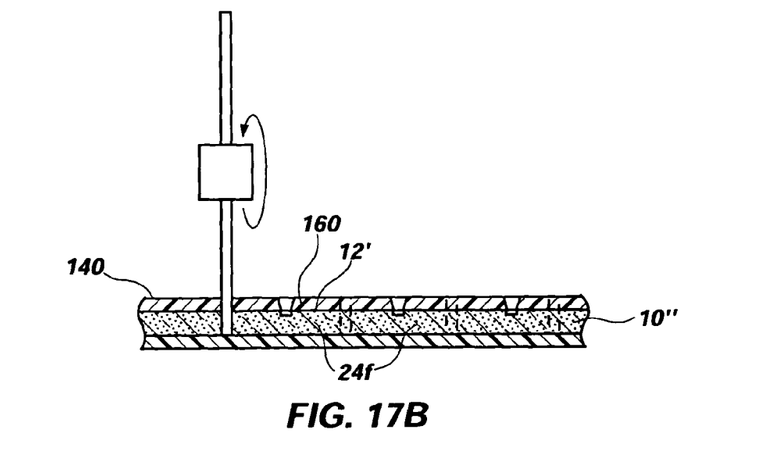
Figure 17C:
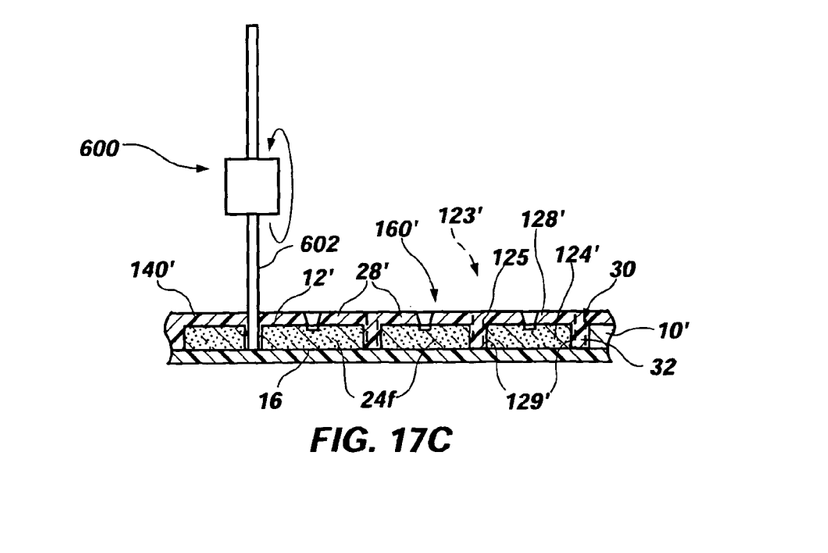

FIGS. 17A through 17C are schematic representations of a method for removing a support structure of the present invention, such as a support ring 40, 40', 40a', 40b', 40c', 40", as shown in FIG. 17A, a support member 140, as shown in FIG. 17B, or a support member 140', as shown in FIG. 17C, from a thinned semiconductor substrate 10".

As shown in FIG. 17A, known dicing processes (e.g., the depicted wafer saw 600, a laser, etc.) may be used to singulate semiconductor devices 24f from thinned semiconductor substrate 10". Since support ring 40, 40', 40" does not cover any of the semiconductor devices 24f that are carried by active surface 12' of thinned semiconductor substrate 10", support ring 40, 40', 40" will remain on the fragments 124p' that result from the dicing process, with each of the resulting semiconductor dice 124' being substantially bare (e.g., active surfaces 12' thereof remaining exposed).

Referring now to FIG. 17B, when the support structure comprises a support structure (e.g., support member 140) that includes an interior portion (e.g., interior portion 160) that covers portions of the active surfaces 12' of semiconductor devices 24f, dicing, or singulation, of the semiconductor devices 24f from one another proceeds through both the interior portion and thinned semiconductor substrate 10". The result of such dicing, or singulation, is a plurality of low-profile packaged semiconductor devices 123'.

FIG. 17C illustrates dicing, or singulation, of a thinned semiconductor substrate 10' that includes trenches 32 along streets 30 between adjacent semiconductor devices 24f, as well as a support member 140' substantially covering active surfaces 12' thereof. As shown, during the thinning process, trenches 32 and material of protective structures 28' may be exposed through back side 16 of semiconductor substrate 10', effectively separating semiconductor devices 24f from one another. Nonetheless, protective structures 28', which comprise portions of interior portion 160' of support member 140', remain connected to one another, preventing the physical separation of semiconductor devices 24f from each another. Support member 140' may be diced, or singulated, as known in the art, such as by use of the illustrated wafer saw 600. When the blade or blades 602 of wafer saw 600 are narrower than the distance across trenches 32, peripheral edges 125 of each singulated semiconductor die 124' will be at least partially covered with peripheral portions 129' of singulated protective structures 128', each of these elements together forming a low-profile packaged semiconductor device 123'.

Once semiconductor devices 24f (FIGS. 17A through 17C) have been physically separated from one another, further processing may occur, such as the selection of known good dice (KGDs), the connection thereof to one or more other semiconductor device components (e.g., a carrier substrate, an interposer, another semiconductor device, etc.), the incorporation thereof into a stacked multi-chip module (MCM) of standard dimensions but increased chip density, or packaging thereof with one or more other semiconductor device components may be conducted, as known in the art.

Although the foregoing description contains many specifics, these should not be construed as limiting the scope of the present invention, but merely as providing illustrations of some of the presently preferred embodiments. Similarly, other embodiments may be devised without departing from the spirit or scope of the present invention. Features from different embodiments may be employed in combination. The scope of the invention is, therefore, indicated and limited only by the appended claims and their legal equivalents rather than by the foregoing description. All additions, deletions and modifications to the invention as disclosed herein which fall within the meaning and scope of the claims, are to be embraced thereby.

What is claimed:

1. A carrier system, comprising:
   a fabrication substrate comprising a semiconductor material and carrying a plurality of complete semiconductor devices; and
   a substantially planar rigid support structure comprising:
      a ring-like structure having an opening formed therein; and
      an attachment surface secured in superimposed relation to a portion of an active surface of the fabrication substrate, the attachment surface being secured to the portion of the active surface of the fabrication substrate adjacent to an outer peripheral edge of the fabrication substrate to expose an entirety of a back side of the fabrication substrate and to prevent flexing and bending of the fabrication substrate during or after a thickness of the fabrication substrate is reduced on the back side of the fabrication substrate opposing the active surface of the fabrication substrate, and wherein the opening formed in the rigid support structure exposes an interior section of the active surface;

wherein an outer periphery of the support structure circumscribes a lateral extent of the plurality of complete semiconductor devices carried by the active surface, in substantially the same plane, at different lateral locations on the active surface.

2. The carrier system of claim 1, wherein the opening formed in the rigid support structure exposes each complete semiconductor device.

3. The carrier system of claim 1, wherein the rigid support structure comprises at least one of a photoimageable polymer and a thermoset polymer.

4. The carrier system of claim 3, wherein the rigid support structure further comprises at least one filler dispersed throughout the photoimageable polymer.

5. The carrier system of claim 4, wherein the at least one filler comprises at least one of silica particles, alumina particles, nitride particles, and polymer particles or fibers.

6. The carrier system of claim 4, wherein the at least one filler has a lower coefficient of thermal expansion than another material of the rigid support structure.

7. The carrier system of claim 1, wherein an outer peripheral portion of the rigid support structure extends laterally from a location superimposed with respect to the fabrication substrate, to a location beyond the outer peripheral edge of the fabrication substrate.

8. The carrier system of claim 7, wherein the outer peripheral portion includes at least one of a marking, a locating feature, and a fixturing feature.

9. The carrier system of claim 1, wherein the rigid support structure at least partially covers the active surface, portions of the rigid support structure located over semiconductor devices that have been fabricated on the active surface comprising package elements for each of the semiconductor devices.

10. The carrier system of claim 1, wherein the rigid support structure includes a plurality of adjacent, mutually adhered regions.

11. The carrier system of claim 10, wherein the plurality of adjacent, mutually adhered regions comprises a plurality of at least partially superimposed, contiguous, mutually adhered layers.

12. The carrier system of claim 1, wherein the rigid support structure is positioned about a periphery of a silicon wafer.

13. A carrier system, comprising:
a fabrication substrate comprising a semiconductor material and carrying a plurality of complete semiconductor devices; and
a substantially planar rigid support structure comprising:
a ring-like structure having an opening formed therein; and
an attachment surface directly adhered to a portion of an active surface of the fabrication substrate, the attachment surface being secured to the portion of the active surface of the fabrication substrate adjacent to an outer peripheral edge of the fabrication substrate to expose an entirety of a back side of the fabrication substrate and to prevent flexing and bending of the fabrication substrate during or after a thickness of the fabrication substrate is reduced, wherein the opening formed in the rigid support structure exposes an interior section of the active surface, wherein an outer periphery of the support structure circumscribes a lateral extent of the plurality of complete semiconductor devices carried by the active surface, and wherein an entirety of the attachment surface of the rigid support structure is directly adhered to the portion of the active surface.

14. The carrier system of claim 13, wherein an outer peripheral edge of the rigid support structure aligns substantially with the outer peripheral edge of the fabrication substrate.

15. A carrier system, comprising:
a fabrication substrate comprising a semiconductor material and carrying a plurality of complete semiconductor devices; and
a substantially planar rigid support structure, comprising:
a ring-like structure having an opening formed therein;
an attachment surface directly secured to a portion of an active surface of the fabrication substrate, the attachment surface being secured to the portion of the active surface of the fabrication substrate adjacent to an outer peripheral edge of the fabrication substrate to expose an entirety of a back side of the fabrication substrate and to prevent flexing and bending of the fabrication substrate during or after a thickness of the fabrication substrate is reduced, wherein an outer periphery of the support structure circumscribes a lateral extent of the plurality of complete semiconductor devices carried by the active surface, wherein the opening formed in the rigid support structure exposes an interior section of the active surface; and
an outer peripheral portion extending laterally from the fabrication substrate, to a location beyond the outer peripheral edge of the fabrication substrate and wherein the outer peripheral portion of the rigid support structure comprises a downwardly extending portion extending toward the back side of the fabrication substrate, the downwardly extending portion located laterally adjacent to the outer peripheral edge of the fabrication substrate.

16. The carrier system of claim 15, wherein the downwardly extending portion is spaced apart from the outer peripheral edge of the fabrication substrate.

17. The carrier system of claim 16, further comprising:
a retention ledge extending inwardly from the downwardly extending portion and overlapping at least a portion of a peripheral portion of the back side of the fabrication substrate.

18. The carrier system of claim 15, wherein at least the outer peripheral portion of the rigid support structure includes a plurality of adjacent, mutually adhered regions.

19. The carrier system of claim 18, wherein the plurality of adjacent mutually adhered regions comprises a plurality of at least partially superimposed, contiguous, mutually adhered layers.

* * * * *